SUPERCONDUCTORS

Filed March 14, 1968

INVENTORS
Peter R. Sahm &
Fred D. Rosi
BY Abraham Sherman
ATTORNEY

United States Patent Office 3,544,316

Patented Dec. 1, 1970

3,544,316

SUPERCONDUCTORS

Peter R. Sahm, Trenton, and Fred D. Rosi, Princeton, N.J., assignors to RCA Corporation, a corporation of Delaware Filed Mar. 14, 1968, Ser. No. 712,979

Int. Cl. C22c *27/00*; H01r *17/12*

U.S. Cl 75—174 8 Claims

ABSTRACT OF THE DISCLOSURE

Superconductive alloys comprise niobium aluminum, in which a portion of the aluminum has been replaced by boron, aluminum, gallium or indium, and nitrogen, phosphorus, arsenic or antimony. When gallium and arsenic are present, the composition may be expressed as $Nb_3Al_{1-x}Ga_yAs_z$, wherein $x$ is about 0.02 to 0.25, and is equal to $y+z$. When $y$ and $z$ are unequal, preferably $y$ is greater than $z$. The gallium and arsenic may be present in equimolecular amounts, as in gallium arsenide.

The alloys can be fabricated by pressing a mixture of powdered niobium, powdered aluminum, and a powdered III–V compound such as gallium arsenide to form a pellet; melting the pellet in an inert ambient; directing a jet of an inert gas against the melt to form a spray; and splattering the spray against a cold surface maintained at a temperature below 400° C. so as to suddenly freeze the spray. An element of the first group, such as gallium, may be added to the mixture to form alloys wherein $y$ is greater than $z$. The frozen spray may be subsequently annealed in an inert ambient at a temperature of about 550° to 800° C.

BACKGROUND OF THE INVENTION

Field of the invention

This invention relates to improved superconductive alloys, and to improved methods of fabricating them.

Description of the prior art

An important parameter of a superconductive material is the strength of the magnetic field at and above which the material ceases to be superconducting. This parameter is known as the critical magnetic field, and depends upon the temperature of the superconductor in a manner which is a fixed characteristic of each superconducting material. Superconductive materials which exhibit a high critical magnetic field are preferred for such applications as the fabrication of superconducting electromagnets, since the critical magnetic field of the particular superconductor utilized will be the highest magnetic field obtainable by the electromagnet. The type of superconductive materials which exhibited the highest critical fields are known as "hard" or Type II superconductors. Another important parameter of a superconductive material is the temperature at and above which the material ceases to be superconducting, and is known as the critical temperature or transition temperature. Superconductors which exhibit high critical temperatures also exhibit high critical fields. The superconductor in commercial use which exhibits the highest critical field is niobium tin, $Nb_3Sn$, which has a critical temperature of 18.2° K. For a discussion of superconductive materials and their applications, see the September 1964 issue of RCA Review. For a discussion of how superconducting materials are utilized to fabricate electromagnets which develop strong magnetic fields while dissipating very little power, see example pages 7–31 of RCA ENGINEER, vol. 12, No. 4, December 1966.

Accordingly, it is an object of this invention to provide improved superconducting materials.

Another object of this invention is to provide improved methods of fabricating improved superconducting materials.

SUMMARY OF THE INVENTION

Superconductive alloys which exhibit high transition temperatures comprise $Nb_3Al$ in which a portion of the Al is replaced by: (A) B, Al, Ga or In, known as the Group III elements; and, (B) N, P, As, or Sb, known as the Group V elements. The said composition is defined by the general formula $Nb_3Al_{1-x}A_yB_z$, wherein the sum of $y$ and $z$ is equal to $x$. A preferred composition range is $Nb_3Al_{1-x}Ga_yAs_z$, wherein $x$ is about 0.02 to 0.25, and is equal to $y+z$. Such alloys may be fabricated by pressing a mixture of powdered Nb, powdered Al, and a powdered III–V compound such as GaAs to form a pellet; melting the pellet in an inert ambient; directing a jet of an inert gas against the melt to form a spray; and splattering the spray against a surface maintained at a temperature below 400° C. so as to suddenly freeze the spray. Advantageously, the frozen spray is annealed. An annealing temperature between 550° and 800° C. is preferred to optimize the transition temperature.

THE DRAWING

The invention will be described in greater detail by the following examples considered in conjunction with the accompanying drawing, in which.

THE PREFERRED EMBODIMENTS

Figure 1:
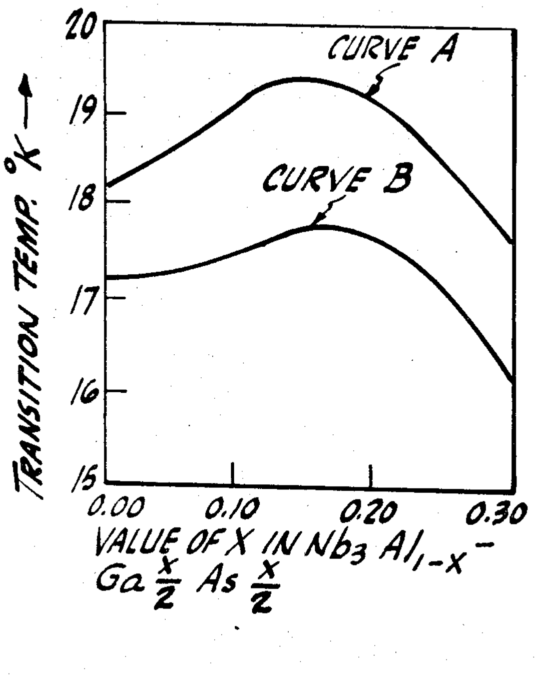
FIG. 1 is a plot showing the variation of the critical temperature of superconductive alloys having the composition $Nb_3Al_{1-x}Ga_{x/2}As_{x/2}$ with changing $x$.

Inspection of the formula $Nb_3Al_{1-x}Ga_yAs_z$ for superconductive alloys, with consideration of the restriction that the sum of $y$ and $z$ is equal to $x$, indicates that $y$ and $z$ may be either equal or unequal. When $y$ and $z$ are equal, each is also equal to $x/2$. The formula of this class of alloys may then be written as $Nb_3Al_{1-x}Ga_{x/2}As_{x/2}$. In FIG. 1, the value of $x$ in the last formula has been plotted as the abscissa and the critical temperature in degrees Kelvin has been plotted as the ordinate. Curve A represents the values of the different critical temperatures obtained for different compositions fabricated and annealed as described below. Curve A indicates that for values of $x$ greater than about 0.02 and less than about 0.25, the critical temperature of the alloy is at least 19° K. As noted above, superconductors that have high critical temperatures also have high critical fields. The shape of Curve A also indicates that a maximum critical temperature of about 19.4° K. is obtainable when $x$ is about 0.15.

One method of measuring the critical temperature of a particular superconductive composition comprises placing a sample of the composition in a plastic tube; positioning the tube inside a small measuring coil; and plotting the self-inductance of the measuring coil in arbitrary units as the ordinate against ordinary temperatures plotted as the abscissa. For a detailed description of this method, see J. L. Cooper, "Transition Temperature of Niobium Stannide," RCA Review, pages 405–413, September 1964.

Figure 2:
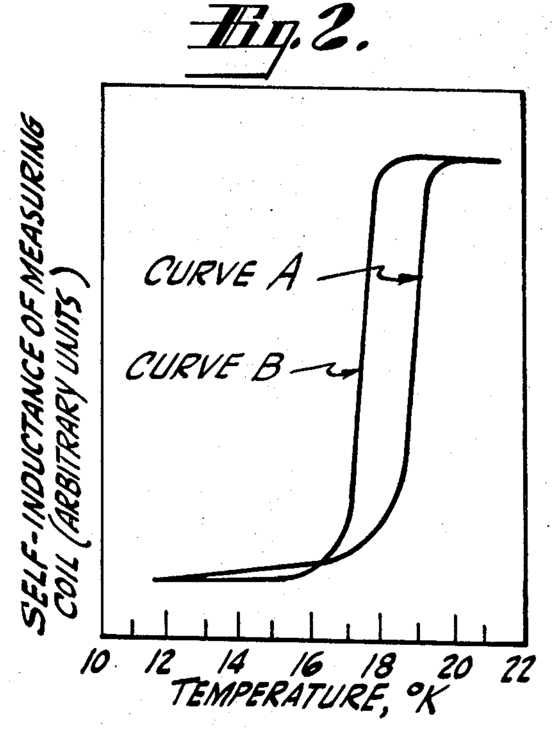
FIG. 2 is a pilot showing the variation with temperature of the self-inductance of the measuring coil for a superconductive alloy having the composition $Nb_3Al_{0.9}Ga_{0.05}As_{0.05}$; and, FIG. 3 is a plot showing the variation of the critical temperature of superconductive alloys having the composition $Nb_3Al_{0.9}Ga_{0.05}As_{0.05}$ with annealing temperature.

FIG. 2 shows such a plot for the particular composition $Nb_3Al_{0.9}Ga_{0.05}As_{0.05}$. Curve A represents such a plot for a superconductive alloy of this composition made and annealed as described below. As the critical temperature of the alloy is approached, the self-inductance of the measuring coil exhibits a steep rise before leveling off. The tangent to the steep-rising portion of the curve intercepts the portion of the curve that represents the normally conducting state at a point which is taken as the critical temperature of the material.

EXAMPLE I

In this example, a mixture with a nominal composition of $Nb_3Al_{0.9}Ga_{0.05}As_{0.05}$ consisting of 27.9 grams powdered niobium, 2.43 grams powdered aluminum and 7.23 grams of powdered gallium arsenide were mixed in a vibrational mixer and cold pressed to form a pellet. The pellet was then arc melted in an inert atmosphere, which consisted of argon. Next, a jet of an inert gas, which was argon in this example, was directed against the melt to form a spray, and the spray was splattered against a cold surface maintained at a temperature below 400° C. so as to suddenly freeze the spray. The cold surface in this example consisted of a copper plate maintained at room temperature. More rapid freezing can be obtained by using a chilled surface, for example a hollow metal plate through which a refrigerant such as cold brine is pumped.

When the critical temperature of this material was measured by the self-inductance method described above, Curve B of FIG. 2 was obtained, which indicates that the suddenly quenched spray has a transition temperature a little less than 18° K.

When the quenched alloy was annealed by reheating it in an inert ambient such as argon to a temperature between 550° C. and 800° C., the critical temperature of the materials was raised to above 19° K., as indicated in Curve A of FIG. 2.

Figure 3:
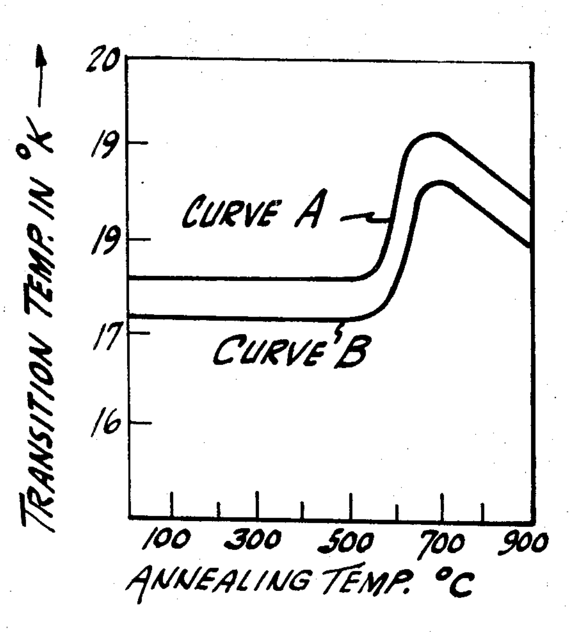

The effect of the annealing temperature on the transition temperature of this alloy is shown by Curve A of FIG. 3. It is seen that annealing temperatures between 500° C. and 800° C. produce the best results, with a maximum at an annealing temperature of 650° C. For comparison, Curve B of FIG. 3 shows the effect of annealing at different temperatures on the transition temperature of pure $Nb_3Al$. It is seen that the transition temperature of the alloy according to this example (Curve A) is higher than the transition temperature of $Nb_3Al$ (Curve B) throughout the entire range.

EXAMPLE II

In this example, the charge utilized consisted of 27.9 grams powdered niobium, 2.29 grams powdered aluminum, and 10.8 grams powdered gallium arsenide. The preparation of the alloy was the same as that described above in Example I. In this example, the nominal composition of the quenched spray corresponds to $$Nb_3Al_{0.85}Ga_{0.085}As_{0.075}$$

Curve A of FIG. 1 indicates that this composition has the highest critical temperature (over 19° K.) in this series of alloys. Curve A of FIG. 1 gives the critical temperature values for the quenched spray after it has been annealed at 650° C., whereas Curve B of FIG. 1 gives the critical temperature values for the quenched spray before annealing. The two curves indicate that, for each composition tested, the annealing process raises the critical temperature of the material at least 1° K.

EXAMPLE III

In this example, the mixture utilized consists of 27.9 grams powdered niobium, 2.43 grams powdered aluminum, and 9.57 grams powdered gallium antimonide. The alloy may be prepared and annealed as described in Example I. The nominal composition of this alloy corresponds to $Nb_3Al_{0.9}Ga_{0.05}Sb_{0.05}$.

EXAMPLE IV

In this example, the mixture utilized consists of 27.9 grams powdered niobium, 2.43 grams powdered aluminum, and 7.28 grams powdered indium phosphide. The alloy may be prepared and annealed as described in Example I. The nominal composition of this alloy corresponds to $Nb_3Al_{0.9}In_{0.05}P_{0.05}$.

EXAMPLE V

In the above examples, the molar amount of the Group III element in the alloy is the same as the molar amount of the Group V element in the alloy. However, superconductive alloys may also be made in which the molar amount of one of these elements is greater than the molar amount of the other element, subject only to the restriction described above as to the sum of the two elements. It appears preferable to utilize alloys in which the molar amount of the Group III element is greater than the molar amount of the Group V element. In this example, the mixture utilized consists of 27.9 grams powdered niobium, 2.29 grams powdered aluminum, 9.48 grams powdered indium arsenide, and 5.74 grams of powdered indium. The molar amount of indium in the alloy is thus made greater than the molar amount of arsenic in the alloy. The alloy may be prepared as described in Example I by pressing the powders to form a pellet arc melting the pellet in an inert ambient, directing a jet of an inert gas against the melt to form a spray, and splattering the spray against a cold surface so as to suddenly freeze the spray. The nominal composition of the alloy of this example corresponds to $Nb_3Al_{0.85}In_{0.1}As_{0.05}$.

The above examples are by way of illustration only, and not by way of limitation. Other combinations of an element from Group III of the Periodic Table and an element from Group V of the Periodic Table may be utilized. Non-stoichiometric compositions may be made, in which the sum of the Group III and Group V elements does not equal the amount of aluminum missing from the $Nb_3Al$, that is, $x$ does not exactly equal the sum of $y$ plus $z$. Various other modifications may be made without departing from the spirit and scope of the invention as set forth in the specification and in the appended claims.

We claim:

1. A quaternary superconductive alloy comprising $Nb_3Al_{1-x}A_yB_z$ wherein the sum of $y$ and $z$ is equal to $x$, and $x$ is not greater than about 0.25 and A is selected from the group consisting of boron, gallium and indium, and B is selected from the group consisting of nitrogen, phosphorous, arsenic and antimony.

2. A superconductive alloy as in claim 1, wherein the molar amount of said first element in said alloy is greater than the molar amount of said second element in said alloy.

3. A quaternary superconductive alloy consisting essentially of $Nb_3Al_{1-x}Ga_yAs_z$ wherein the sum of $y$ and $z$ is equal to $x$, and $x$ is not greater than about 0.25.

4. A quaternary superconductive alloy consisting essentially of $Nb_3Al_{1-x}Ga_yAs_z$, wherein the sum of $y$ and $z$ is equal to $x$, and $x$ is about 0.02 to 0.25.

5. A superconductive alloy as in claim 4, wherein $y$ is greater than $z$.

6. A superconductive alloy as in claim 4, wherein $x$ is about 0.15.

7. A superconductive alloy consisting essentially of $Nb_3Al_{1-x}Ga_{x/2}As_{x/2}$, wherein $x$ is about 0.02 to 0.25.

8. A superconductive alloy as in claim 7, wherein $x$ is about 0.15.

References Cited

UNITED STATES PATENTS

| | | | |
|---|---|---|---|
| 3,181,936 | 5/1965 | Denny et al. | 29—194 |
| 3,244,490 | 4/1966 | Sour | 75—174 X |
| 3,256,118 | 6/1966 | Speidel | 148—2 |

OTHER REFERENCES

Metallurgy of Advanced Electronic Materials (V19), Metallurgical Society Conferences, Philadelphia, 1962, pp. 78–83.

CHARLES N. LOVELL, Primary Examiner

U.S. Cl. X.R.

148—133; 335—216